United States Patent

Hagn

[11] Patent Number: 6,042,683
[45] Date of Patent: Mar. 28, 2000

[54] METHOD AND DEVICE FOR PRODUCING AN ASPIRATION SURFACE ON AN OBJECT, AND ELECTRICAL COMPONENT OBTAINED THEREBY

[76] Inventor: Erwin Hagn, Georg-Schweiger-Str. 25a, Moosburg D-85368, Germany

[21] Appl. No.: 08/948,423

[22] Filed: Oct. 10, 1997

[30] Foreign Application Priority Data

Oct. 10, 1996 [DE] Germany ................ 296 17 668 U

[51] Int. Cl.⁷ .................................................. B32B 31/28
[52] U.S. Cl. .................... 156/275.5; 156/291; 156/292
[58] Field of Search .................... 156/152, 292, 156/295, 309.6, 323, 274.2, 273.7, 275.5, 247, 249, 552, 383; 264/496, 259, 272.11, 272.12, 319; 269/21, 903; 257/704; 438/760; 336/65; 29/592.1

[56] References Cited

U.S. PATENT DOCUMENTS

| | | |
|---|---|---|
| 4,633,370 | 12/1986 | Hamuro et al. . |
| 4,820,369 | 4/1989 | Kubo et al. . |
| 4,916,805 | 4/1990 | Ellrich et al. . |
| 5,357,077 | 10/1994 | Tsuruta . |

FOREIGN PATENT DOCUMENTS

| | | |
|---|---|---|
| 0 540 497 | 5/1993 | European Pat. Off. . |
| 0 617 437 | 9/1994 | European Pat. Off. . |
| 32 26 733 | 7/1983 | Germany . |
| 35 07 610 | 9/1985 | Germany . |
| 86 04 096 | 6/1986 | Germany . |
| 36 15 307 | 11/1987 | Germany . |
| 37 36 563 | 5/1988 | Germany . |
| 37 10 184 | 10/1988 | Germany . |
| 3 805 572 | 2/1989 | Germany . |
| 38 06 738 | 9/1989 | Germany . |
| 40 20 305 | 1/1992 | Germany . |
| 41 01 790 | 7/1992 | Germany . |
| 41 29 146 | 3/1993 | Germany . |
| 94 10 532 | 10/1994 | Germany . |
| 44 32 909 | 3/1995 | Germany . |
| 94 20 283 | 5/1995 | Germany . |
| 8-17602 | 1/1996 | Japan . |
| WO 90/13135 | 11/1990 | WIPO . |
| WO 91/18494 | 11/1991 | WIPO . |
| 96/19814 | 6/1996 | WIPO ................ H01F 27/02 |

OTHER PUBLICATIONS

Patent Abstracts of Japan, vol. 17, No. 528 (E–1437), Sep. 22, 1993, JP 5–145283, Jun. 11, 1993.

Patent Abstracts of Japan, vol. 18, No. 507 (E–1609), Sep. 22, 1994, , JP 6–176927, Jun. 24, 1994.

Patent Abstracts of Germany, DE 3 807 892, Jun. 1, 1994.

Patent Abstracts of Germany, DE 3 938 718, May. 29, 1991.

EPP, pp. 36, "Neuer SMD–Bestueckungs–Vollautomat", Jul./Aug. 1992.

Hartmut Michel, et al.,Siemens, vol. 3, pp. 1–4, "MKT–Kondensatoren in Tauchloebarer Chipbauform", 1985.

Rainer Rohm, Der Elektroniker, No. 2, pp. 27–32, "SMD–Bestueckungsautomat Fuer Leiterplatten Und Keramiksubstrate", 1986.

Rolf D. Schraft, et al., Technische Rundschau, pp. 16–20, "Stand der Technik Bei der SMT–'Bestueckung", 1988.

*Primary Examiner*—Michael W. Ball
*Assistant Examiner*—Gladys Piazza
*Attorney, Agent, or Firm*—Hoffmann & Baron, LLP

[57] ABSTRACT

A method and a device for producing an aspiration surface on an object, preferably an electrical component intended for the SMD mounting technique. The planar aspiration surface is formed on the surface located opposite the mounting side of the component by applying an adhesive mass onto the component and molding the mass through cover band arranged above the component with a die to shape the adhesive mass into a planar surface. Following curing of the adhesive mass, the cover band is separated from the mass, resulting in a component with a planar aspiration surface for reliable and unproblematic aspiration, pick-up and transport. The adhesive mass may consist of a liquefiable or volatilizable material such as wax, colophonium or plastic.

8 Claims, 2 Drawing Sheets

METHOD AND DEVICE FOR PRODUCING AN ASPIRATION SURFACE ON AN OBJECT, AND ELECTRICAL COMPONENT OBTAINED THEREBY

BACKGROUND OF THE INVENTION

1. Field of the Invention

The invention relates to a method for producing an aspiration surface on an object, such as an electrical component used in the Surface Mounted Devices (SMD) mounting technique, wherein the aspiration surface is arranged on a surface located opposite the mounting side of an object in a supply module. Further, the invention relates to a device for implementing this method, an electrical component obtained thereby, and a supply module in a blister strip.

2. Discussion of the Background

The miniaturization of circuitry and circuit boards has resulted in smaller individual electrical components. Manual and automatic manipulation of these components has become difficult, particularly since their small size reduces their stability.

When processing small electrical components it is known to perform SMD mounting on circuit boards. To this end, the components may be taken from a supply module with suction tweezers and accurately placed on the circuit board.

The components may have cylindrical shapes (e.g., resistors), helical shapes (e.g., electrical coils), or other shapes having non-planar surfaces. Therefore, precise grasping with the aid of suction tweezers is frequently not possible.

In order to solve this problem, German Utility Model DE-GM 94 10 532 proposes to attach a platelet on the top side of the component. This platelet is fastened to the component with an adhesive and arranged to provide a planar surface on the side opposite the mounting side of the electrical component. Although components having this configuration can be grasped by suction tweezers, they require the extra expenditure associated with providing the platelets. This also necessitates an additional precision processing step which is costly in terms of device technology and time.

SUMMARY OF THE INVENTION

Accordingly, an object of this invention is to provide a novel method and device for producing a planar aspiration surface on an object in a simple manner. The method includes the steps of applying an adhesive mass onto the top side of the object following the correct insertion of the object into the supply module, arranging a cover band above the adhesive mass, and causing a die to exert pressure on the cover band in such a manner that a planar aspiration surface is formed on the adhesive mass located underneath. The device comprises apportioning means for applying a predetermined amount of an adhesive mass onto the object, an arranger for arranging a cover band above the adhesive mass, and a die whereby a planar aspiration surface can be molded on the adhesive mass underneath the coverband.

In accordance with the invention, a planar aspiration surface can be provided for components having non-planar surfaces. This ensures reliable and unproblematic aspiration of the object by an insertion machine, for example. Advantageously the objects intended for mounting can, despite their small size, be grasped reliably. The objects can be transported to a circuit board and positioned on the circuit board in mass production with precision. Moreover faulty grasping of the objects by suction tweezers is avoided despite the components' original non-planar geometry. The component is effectively prevented from tilting or dropping during transport or placement on the circuit board, and there is no need to apply a platelet on the object. Instead, it is sufficient to deform an adhesive mass into a planar aspiration surface. This reduces costs because the precision application of the platelet may be eliminated. It is another advantage that the components for applying the adhesive mass need not be taken from the supply module because this step can be performed with precision by the apportioning means. If the adhesive mass is volatilizable or liquefiable, it may be volatilized or liquefied following mounting or processing. Subsequent tuning of components such as SMD coils is therefore possible.

It is another advantage that the cover band for covering the supply module provides the surface used in producing the planar aspiration surface. This permits exertion of a pressure by the die to permanently deform the adhesive mass without any risk of the die adhering to the adhesive mass. In order to obtain objects that are ready for mounting, it is only necessary to separate the cover band from the objects. Advantageously, the method of the invention and the corresponding device may readily be incorporated into the production sequence of the objects. This enables continuous pre-fabrication of electrical components in mass production.

The adhesive mass is cured with a curer which accelerates the process of curing the adhesive bond. This further reduces the time required for producing objects having planar aspiration surfaces. Curing is preferably performed by applying electromagnetic radiation energy, in particular light in the visible range. To permit the radiation to take effect on the adhesive mass arranged underneath the cover band, the cover band transmits radiation. This allows for effective curing in a simple manner while employing known irradiating technologies.

When the cover band, following production of the planar aspiration surface, is separated from the object by a stripping device, the objects having planar aspiration surfaces are provided individually in each supply module in a condition that permits their further use.

It is also advantageous if, following stripping of the cover band, a cover band applicator fastens the cover band on the surface of the supply module, preferably by thermal bonding. For this purpose, the previously stripped cover band is preferably used anew. In this case the cover band may serve as an opposite surface for the formation of the planar aspiration surface, as well as for securely closing the supply module to prevent the loss of components. Consequently, an additional cover band is not required for producing the planar aspiration surface of the invention, and the cost of producing the aspiration surface is further reduced.

If a blister strip constituted by several supply modules is used, continuous production of the components is possible. The blister strip permits continuous passage of the components through the device of the invention and thereby reduces the expenditure required in constructing the device.

In accordance with another aspect of the invention, a component, preferably an electrical component, is provided having the planar aspiration surface formed by the method of the invention. This component comprises few elements relative to the prior art and may therefore be produced more simply. It also permits secure grasping, reliable transport, and precise positioning of the component by suction tweezers or the like. The component is thus suited for fully automated mounting to a circuit board.

In accordance with another aspect of the invention, a blister strip furnishes the supply modules. The blister strip comprises a dot-shaped marking layer present on the cover band. The marking layer informs the user of the fact that the object present in the blister strip has a planar aspiration surface obtained in accordance with the method of the invention. This indicates that the object in the blister strip is suited for automated mounting. Residues of the cured adhesive mass can form the marking layer in a step inherent to the production of the aspiration surface, making separate marking on the blister strip unnecessary.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 2:
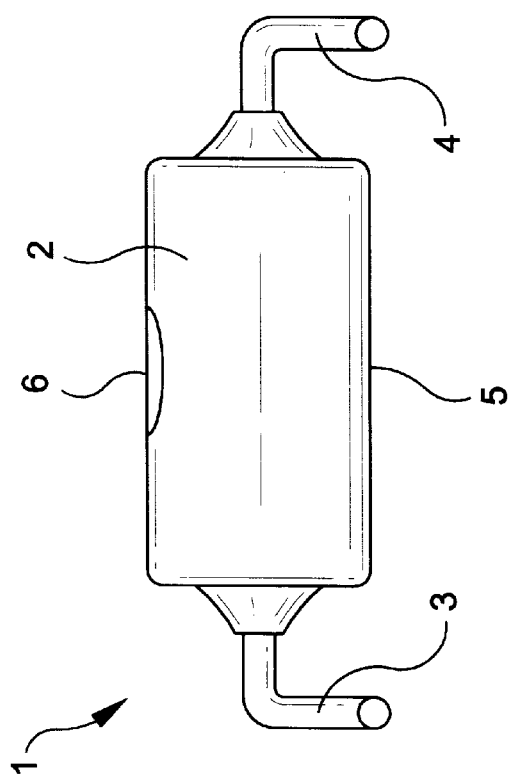
FIG. 2 is a front view of the electrical component according to the invention.
Figure 1:
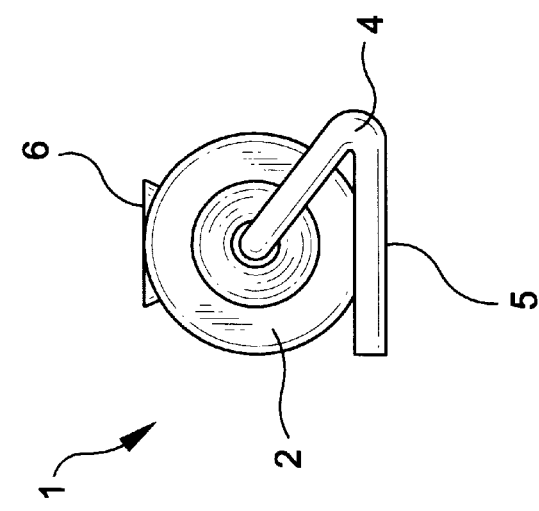
FIG. 1 is a side view of an electrical component according to the invention.

Referring now to the drawings, wherein like reference numerals designate identical or corresponding parts throughout several views, and more particularly to FIGS. 1 and 2 thereof, which show an electrical component which should be understood to be exemplary for the various possible applications of the invention, an inductance coil 1 including an essentially cylindric main body 2 and leads 3 and 4. A planar aspiration surface 6 is formed on the main body 2 of the inductance coil 1 opposite a mounting side 5. The inductance coil 1 is therefore suited for being aspirated by suction tweezers (not shown) in a known manner, picked up and transported to a circuit board or the like, and precisely positioned.

The method steps for producing the aspiration surface 6 on the inductance coil 1 shall be explained below by referring to FIG. 3.

Figure 3:
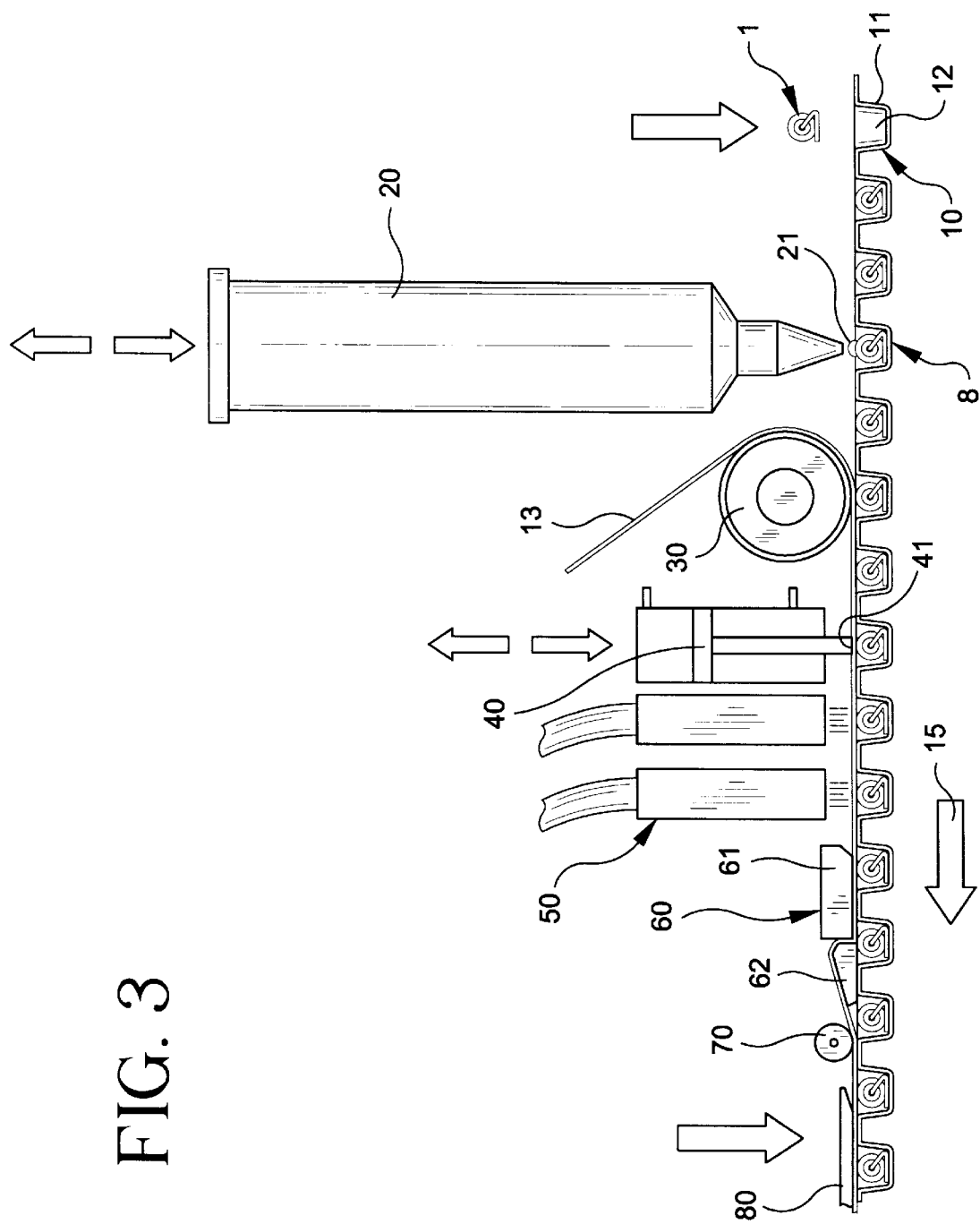
FIG. 3 shows a device for implementing the method for producing the aspiration surface on the component.

In accordance with the representation in FIG. 3, the inductance coils 1 are placed in a blister strip 8 comprised of several supply modules 10 in a known manner (e.g., by a shaker conveyor or a feeding screw) in the correct position and orientation. The blister strip 8 comprises a blister body 11 which includes depressions 12 for receiving the inductance coils 1. The blister strip 8 advances stepwise in the direction of the arrow 15.

Apportioning means 20 are provided downstream thereof for the purpose of applying an adhesive mass 21 in a precisely controlled manner on the surface of the inductance coil 1 which is located opposite its mounting side 5. The amount of adhesive mass is selected to enable formation of a sufficiently large planar aspiration surface 6 on the inductance coil 1. The amount of adhesive mass 21 may vary depending on the configuration and size of the component.

Subsequently, a transparent cover band 13 is placed over the inductance coils 1 and the adhesive mass 21 by means of a device 30. The device 30 can be a deflection roller for deflecting a cover band 13 which is supplied onto the blister strip 8 by a reel, for example.

This is followed by activation of a die 40 which reciprocates vertically with respect to the transport direction of the blister strip 8 in accordance with the representation of FIG. 3. Progress of the blister strip 8 is controlled such that the die 40 will be positioned above the adhesive mass 21 present on a respective inductance coil 1, and press the cover band 13 in this location onto the adhesive mass 21. The adhesive mass 21 is thereby deformed by the die 40 and shaped into a planar surface.

Due to the adhesion of the mass 21, the cover band 13 is bonded to a respective inductance coil 1.

Subsequently, the adhesive mass is cured with a curing device 50 by the application of radiation energy. In FIG. 3, two co-operating elements of the curing device 50 provide a curing path with sufficient UV radiation to cure the adhesive mass. Accordingly, the cover band 13 is designed to transmit UV radiation.

Next, the cover band 13 is separated from the cured mass 21 on the inductance coil 1 by a stripping device 60. For this purpose the stripping device 60 includes holding-down means 61 and stripping means 62. Between the holding-down means 61 and the stripping means 62, the cover band 13 is deflected upwardly with respect to the transport direction of the blister strip 8 and carried off. The design of stripping means 62 and holding-down means 61 ensures that the inductance coils 1 will not be lifted out of the blister strip 8.

The mass 21 has already been cured at this point and maintains the configuration of a planar surface. In this respect it is important that the materials for the cover band 13 and for the adhesive mass 21 are selected such that the adhesive mass 21 will remain on the inductance coil 1 during stripping of the cover band 13 while only insubstantial residues appear on the cover band 13. Since the cover band 13 consists of transparent material, any residual mass 21 on the cover band 13 is perceivable and serves as a marking layer which indicates that the object present in the blister strip 8 has been obtained in accordance with the method of the invention and has a planar aspiration surface.

A cover band application device 70 having the form of a reel is provided downstream. The cover band application device 70 reapplies the stripped cover band 13 onto the blister strip 8. Thermal bonding means 80 unite the cover band 13 with the blister strip 8 to effectively prevent the respective inductance coils 1 from dropping out during transport. The connection between cover band 13 and mass 21 having been neutralized by the stripping device 60, the inductance coils 1 are provided loosely in the depressions of the blister strip 8.

Other configurations are also possible. The adhesive mass 21 may be cured with a suitable additive, in which case the curing device 50 can be omitted. It is also possible to omit the stripping device 60 and perform separation of cover band 13 and mass 21 immediately prior to mounting the inductance coils 1. It is further possible to utilize any other type of stripping device which can reliably separate the cover band 13 and the mass 21 without substantially impairing the planar configuration of the aspiration surface 6.

Instead of renewed feeding of the cover band 13 following separation by the stripping device 60, another cover band may be arranged on the blister strip 8 with another feeding reel and the device 70. In this case, care should be taken that the cover band 13 is reliably carried off downstream from the stripping device 60.

The design and control of the die 40 may be of any type as long as it is suited for shaping the mass 21 into a planar surface.

The described method and the corresponding device may be employed with electrical components of various configurations and sizes. It is possible to utilize the method and the device in the mechanical arts for forming aspiration surfaces on small-size components, to facilitate their transport. Specific applications exist in the field of automated mechanical mounting. Finally, the invention may be used in conjunction with any type of object that requires a specific surface shape for safe and reliable grasping and transport, e.g., by suction tweezers or other customary tools in mounting technology.

For mounting movable mechanical components or electrical components which require further adjustments after mounting, the adhesive mass can be made of material which may be liquefied, evaporated or volatilized during subsequent processing after mounting. Liquification or volatilization may be performed by heating the aspiration surface, resulting in liquification or evaporation of the adhesive mass while the solder or means of fixation of the component on a circuit board or in a system remains firm.

In accordance with a preferred embodiment, the volatilizable or liquefiable material is wax, colophonium and/or plastic material which will volatilize or flow off at a solder-processing temperature (reflow soldering temperature) of, for example, 230° to 250° C. In this manner, the convolutions of a coil may be tuned following soldering. Volatazable or liquifiable material is also suited for movable mechanical components which are to be processed as SMD components. If the aspiration surface blocks the mobility of the mechanical component, the aspiration surface may be volatilized or liquefied by heating or irradiation.

Rather than use a blister strip, the supply modules can be provided by other known means, for example, with micropack feeders provided on reels.

In order to allow for mass processing, the device of the invention can be arranged in multiple parallel arrangement.

The invention discloses a method and a device for producing an aspiration surface 6 on an object, preferably an electrical component intended for the SMD mounting technique. In addition, the invention furnishes an electrical component 1 comprising a planar aspiration surface 6 on the surface located opposite the mounting side 5. The aspiration surface 6 is formed by applying an adhesive mass 21 on the component 1, molding through a cover band 13 arranged above it with a die 40, and shaping the mass 21 into a planar surface. Following curing of the adhesive mass 21, the cover band 13 is separated from the mass 21 to provide a component 1 having a planar aspiration surface 6 which may readily be aspirated, picked up, and transported.

Obviously, numerous modifications and variations of the present invention are possible in light of the above teachings. It is therefore to be understood that within the scope of the appended claims, the invention may be practiced otherwise than as specifically described herein.

I claim:

1. A method for producing an aspiration surface on an object in a supply module, said method comprising the steps of:

inserting the object into the supply module;
   applying an adhesive mass on a top side of the object;
   arranging a first cover band above the adhesive mass;
   exerting pressure on the first cover band with a die to form a planar aspiration surface on the adhesive mass applied on the top side of the object; and
   separating the first cover band from the adhesive mass with a stripping device.

2. The method according to claim 1, further comprising the step of curing the adhesive mass.

3. The method according to claim 1, wherein said adhesive mass comprises a material which is liquefied or volatilized when heated.

4. The method according to claim 3, wherein the material is a least one of wax, colophonium, and plastic.

5. The method according to claim 2, wherein the first cover band transmits radiation, and the step of curing the adhesive mass includes irradiating the adhesive mass with electromagnetic radiation.

6. The method according to claim 1, further comprising the step of thermally bonding a second cover band on the surface of the supply module after the separating step.

7. The method according to claim 1, further comprising the step of thermally bonding the first cover band on the surface of the supply module after the separating step.

8. The method according to claim 1, further comprising the step of positioning the supply modules on a blister strip the blister strip including the supply modules thereon.

* * * * *